(12) United States Patent
Kamata

(10) Patent No.: US 10,845,420 B2
(45) Date of Patent: Nov. 24, 2020

(54) VOLTAGE DETECTING APPARATUS

(71) Applicant: KEIHIN CORPORATION, Tokyo (JP)

(72) Inventor: Seiji Kamata, Utsunomiya (JP)

(73) Assignee: KEIHIN CORPORATION, Tokyo (JP)

( * ) Notice: Subject to any disclaimer, the term of this patent is extended or adjusted under 35 U.S.C. 154(b) by 364 days.

(21) Appl. No.: 15/654,780

(22) Filed: Jul. 20, 2017

(65) Prior Publication Data

US 2018/0088180 A1    Mar. 29, 2018

(30) Foreign Application Priority Data

Sep. 28, 2016 (JP) .................................. 2016-188966

(51) Int. Cl.
    *G01R 31/392* (2019.01)
    *G01R 31/382* (2019.01)
    (Continued)

(52) U.S. Cl.
    CPC .............. *G01R 31/392* (2019.01); *B60L 3/12* (2013.01); *B60L 58/21* (2019.02);
    (Continued)

(58) Field of Classification Search
    CPC .. B60L 2240/547; B60L 2260/44; B60L 3/12; B60L 58/21; G01R 19/16542;
    (Continued)

(56) References Cited

U.S. PATENT DOCUMENTS

| 2004/0109274 A1* | 6/2004 | Sato .................... H02J 7/0031 361/90 |
| 2004/0155629 A1* | 8/2004 | Kobayashi ............ H02J 7/0016 320/127 |

(Continued)

FOREIGN PATENT DOCUMENTS

| CN | 105846803 A | 8/2016 |
| CN | 106885955 A | 6/2017 |

(Continued)

OTHER PUBLICATIONS

JPO Notice of Reasons for Rejection for corresponding JP Application No. 2016-188966; dated Jan. 21, 2020.

(Continued)

*Primary Examiner* — Roy Y Yi
*Assistant Examiner* — Geoffrey T Evans
(74) *Attorney, Agent, or Firm* — Cantor Colburn LLP

(57) ABSTRACT

A voltage detecting apparatus includes: a voltage detecting unit configured to detect a voltage of a battery supplying power to a load; a discharge circuit configured to discharge the battery; a protection circuit disposed between the voltage detecting unit and the battery and between the discharge circuit and the battery; and a determination unit configured to estimate an internal resistance of the protection circuit on the basis of a first voltage detected by the voltage detecting unit when the discharge circuit is in a non-operating state and a second voltage detected by the voltage detecting unit when the discharge circuit is in an operating state and determine a half-cut state of the protection circuit on the basis of a result of the estimation.

5 Claims, 2 Drawing Sheets

(51) Int. Cl.
*G01R 31/396* (2019.01)
*H02J 7/00* (2006.01)
*B60L 58/21* (2019.01)
*H01M 10/42* (2006.01)
*H01M 10/48* (2006.01)
*G01R 31/3835* (2019.01)
*G01R 1/36* (2006.01)
*G01R 31/74* (2020.01)
*G01R 19/165* (2006.01)
*B60L 3/12* (2006.01)
*G01R 35/00* (2006.01)

(52) U.S. Cl.
CPC ..... *G01R 19/16542* (2013.01); *G01R 31/382* (2019.01); *G01R 31/396* (2019.01); *H01M 10/4285* (2013.01); *H01M 10/48* (2013.01); *H02J 7/0021* (2013.01); *H02J 7/0026* (2013.01); *B60L 2240/547* (2013.01); *B60L 2260/44* (2013.01); *G01R 1/36* (2013.01); *G01R 31/3835* (2019.01); *G01R 31/74* (2020.01); *G01R 35/00* (2013.01); *H01M 2220/20* (2013.01); *Y02T 10/70* (2013.01)

(58) Field of Classification Search
CPC ........ G01R 1/36; G01R 31/07; G01R 31/382; G01R 31/3835; G01R 31/392; G01R 31/396; G01R 35/00; H01M 10/4285; H01M 10/48; H01M 2220/20; H02J 7/00; Y02T 10/7005; Y02T 10/7061

See application file for complete search history.

(56) References Cited

U.S. PATENT DOCUMENTS

| | | | |
|---|---|---|---|
| 2007/0053230 A1* | 3/2007 | Kanno | G11C 29/028 365/200 |
| 2012/0224289 A1 | 9/2012 | Peterson et al. | |
| 2020/0067302 A1* | 2/2020 | Tsuchiya | H01M 10/48 |

FOREIGN PATENT DOCUMENTS

| | | |
|---|---|---|
| JP | S63292547 A | 11/1988 |
| JP | H09322392 A | 12/1997 |
| JP | 2002005968 A | 1/2002 |
| JP | 2004227780 A | 8/2004 |
| JP | 2004266992 A | 9/2004 |
| JP | 2007067340 A | 3/2007 |
| JP | 2007531211 A | 11/2007 |
| JP | 2010078530 A | 4/2010 |
| JP | 2014007883 A | 1/2014 |
| JP | 2014093864 A | 5/2014 |
| JP | 2014239582 A | 12/2014 |
| JP | 2015060746 A | 3/2015 |

OTHER PUBLICATIONS

CNIPA Office Action for corresponding CN Application No. 201710674658.4, dated Aug. 4, 2020.

* cited by examiner

_US 10,845,420 B2_

VOLTAGE DETECTING APPARATUS

CROSS-REFERENCE TO RELATED APPLICATION

The present application claims priority under 35 U.S.C. § 119 to Japanese Application No. 2016-188966 filed Sep. 28, 2016, the entire content of which is incorporated herein by reference.

BACKGROUND OF THE INVENTION

Field of the Invention

The present invention relates to a voltage detecting apparatus.

Description of Related Art

In Japanese Unexamined Patent Application First Publication No. 2014-007883, a circuit protecting apparatus protecting a monitoring circuit that monitors the voltages of a battery pack has been disclosed. This circuit protecting apparatus is a circuit interposed between a battery pack and a monitoring circuit and is configured by a plurality of fuses inserted into a plurality of detection lines connecting input terminals of the monitoring circuit and the terminals of a plurality of battery cells configuring the battery pack and a plurality of Zener diodes each disposed between a pair of detection lines corresponding to each of the battery cells.

SUMMARY OF THE INVENTION

The circuit protecting apparatus described above is a protection circuit interposed between a battery pack and a monitoring circuit and is an error factor for the voltages of the battery pack monitored by the monitoring circuit. Particularly, among the plurality of fuses and the plurality of Zener diodes configuring the circuit protecting apparatus, the plurality of fuses are interposed between the input terminals of the monitoring circuit and the terminals of the battery cell and form an error factor having a high contribution proportion for the detected voltages of the battery cells detected by the monitoring circuit.

As is well known, in a fuse, a conductor connecting a pair of terminals is fused according to an overcurrent. In this fusing, in addition to a state in which the conductor is completely cut, there is a half-cut state. Currently, there is no unit detecting whether or not a fuse is in a half-cut state, and, before reaching a half-cut state, the detected voltage of a battery cell detected by the monitoring circuit may be extremely different from the intended output voltage of the battery cell.

An embodiment of the present invention takes into consideration the situation described above, and an object thereof is to detect a half-cut state of a protection circuit.

In order to achieve this object by solving the problems described above, the present invention employs the following embodiments.

(1) According to an aspect of the present invention, there is provided a voltage detecting apparatus including: a voltage detecting unit configured to detect a voltage of a battery supplying power to a load; a discharge circuit configured to discharge the battery; a protection circuit disposed between the voltage detecting unit and the battery and between the discharge circuit and the battery; and a determination unit configured to estimate an internal resistance of the protection circuit on the basis of a first voltage detected by the voltage detecting unit when the discharge circuit is in a non-operating state and a second voltage detected by the voltage detecting unit when the discharge circuit is in an operating state and determine a half-cut state of the protection circuit on the basis of a result of the estimation.

(2) In the aspect (1) described above, a voltage correcting unit configured to correct an error in the first voltage on the basis of the result of the estimation may be further included.

(3) In the aspect of (1) or (2) described above, the battery may be a battery pack configured by a plurality of battery cells, the voltage detecting unit and the discharge circuit may be disposed for each of the battery cells, and the voltage correcting unit may be configured to correct an error in the first voltage for each of the battery cells.

(4) In any one of the aspects (1) to (3) described above, the voltage detecting unit may be configured to detect the first voltage and the second voltage in a state in which a connection between the battery and the load is blocked.

(5) In any one of the aspects (1) to (4) described above, the voltage correcting unit may be configured to output an instruction signal blocking a connection between the battery and the load in a case where the internal resistance of the protection circuit estimated on the basis of the first voltage and the second voltage is greater than or equal to a predetermined threshold.

(6) In any one of the aspects (1) to (5) described above, the voltage detecting unit may be configured to detect the first voltage and the second voltage on the basis of a pair of electric potentials input from output terminals of the battery through low pass filters, and the discharge circuit may be configured to include a pair of discharge resistors having one ends connected to input terminals of the low pass filters and an opening/closing switch connected between the other ends of the pair of discharge resistors.

(7) Any one of the aspects (1) to (6) described above, wherein the protection circuit may be a fuse.

According to an embodiment of the present invention, a half-cut state of a protection circuit can be detected.

DETAILED DESCRIPTION OF THE INVENTION

Here, an embodiment of the present invention will be described with reference to the drawings.

Figure 1:
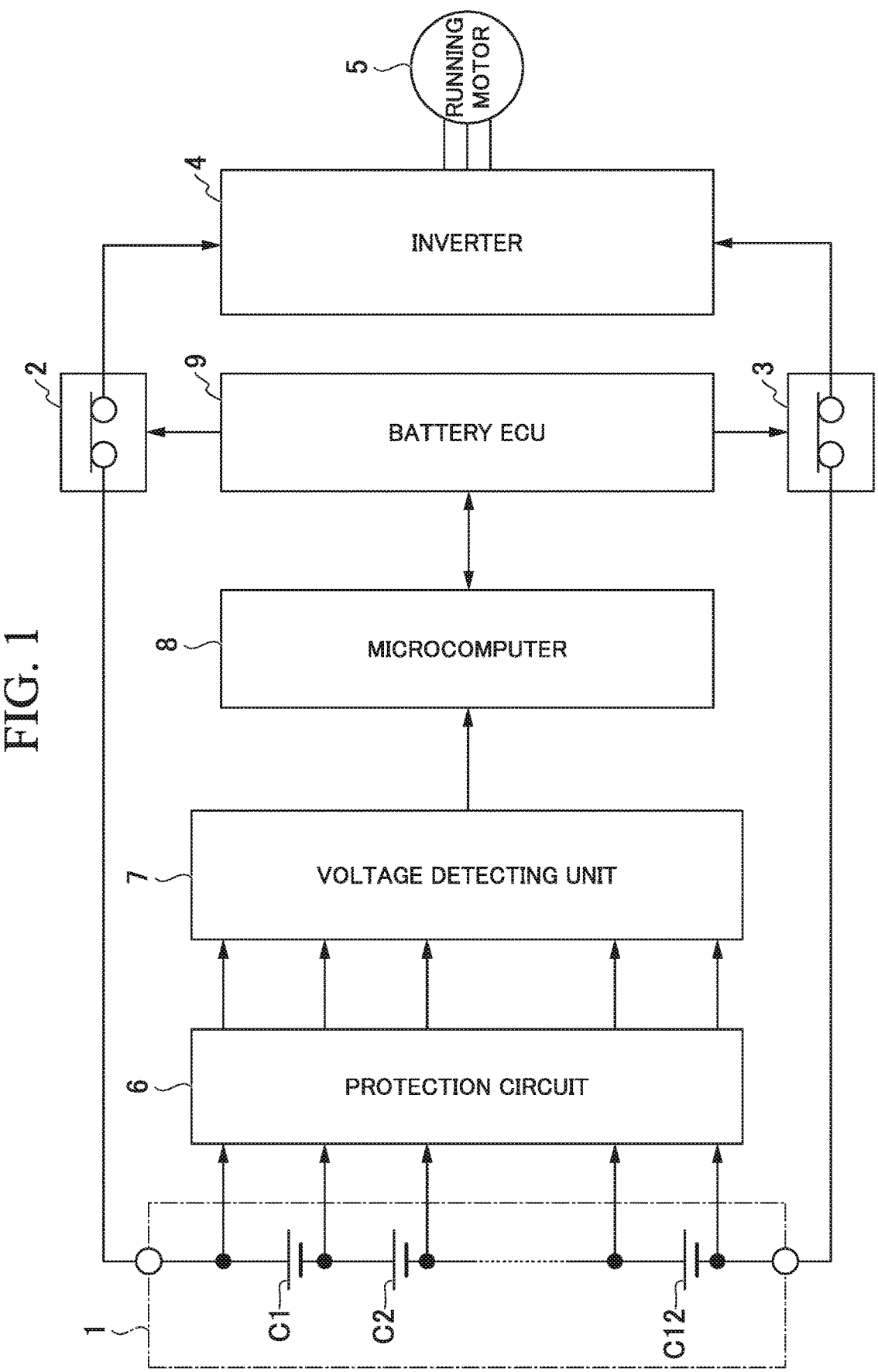
FIG. 1 is a block diagram illustrating the functional configuration of a vehicle running system in which a voltage detecting apparatus according to an embodiment of the present invention is included.

A vehicle running system illustrated in FIG. 1 is disposed in a vehicle such as an electric vehicle or a hybrid vehicle that obtains a driving force for traveling by driving a motor using electric power.

This vehicle running system, as illustrated in FIG. 1, includes a battery pack 1 (battery), a main contactor 2, a sub contactor 3, an inverter 4, a running motor 5, a protection circuit 6, a voltage detecting unit 7, a microcomputer 8, and a battery ECU 9. Among such constituent elements, the protection circuit 6, the voltage detecting unit 7, and the microcomputer 8 configure a voltage detecting apparatus according to this embodiment. Here, the microcomputer 8 is a constituent element corresponding to a voltage correcting unit according to the present invention.

The battery pack 1 is a battery pack in which 12 battery cells b1 to b12 are connected in series. A positive terminal of the battery cell b1 positioned at the top is a positive terminal (one output terminal) of the battery pack 1, and a negative terminal of the battery cell b12 positioned at the bottom is a negative terminal (the other output terminal) of the battery pack 1. Here, a total of 12 of the battery cells b1 to b12 of the battery pack 1 is merely an example, and the battery pack 1 may also include more battery cells or fewer battery cells.

The main contactor 2 is a conduction switch including an exciting coil and a pair of contact points changing to an open state or a closed state in accordance with a power feed state of the exciting coil. One of the contact points is connected to the positive terminal of the battery pack 1, and the other of the contact points is connected to a first input terminal of the inverter 4. This main contactor 2 is set to an open state or a closed state on the basis of a drive current supplied from the battery ECU 9 to the exciting coil, whereby switching between connection/disconnection between the positive terminal of the battery pack 1 and the first input terminal of the inverter 4 is performed.

The sub contactor 3, similar to the main contactor 2, is a conduction switch including an exciting coil and a pair of contact points changing to an open state or a closed state in accordance with a power feed state of the exciting coil. One of the contact points is connected to a negative terminal of the battery pack 1, and the other of the contact points is connected to a second input terminal of the inverter 4. This sub contactor 3 is set to an open state or a closed state on the basis of a drive current supplied from the battery ECU 9, whereby switching between connection/disconnection between the negative terminal of the battery pack 1 and the second input terminal of the inverter 4 is performed.

The inverter 4 is a three-phase inverter including the first input terminal, the second input terminal, and first to third output terminals. High-frequency power (DC power) is input from the battery pack 1 to the first and second input terminals of the inverter 4. This inverter 4 converts the high-frequency power (DC power) of the battery pack 1 input to the first and second input terminals into AC power (three-phase AC power) having a predetermined frequency and three phases (a U phase, a V phase, and a W phase) and outputs the AC power in the three phases from the first to third output terminals to the running motor 5. Such an inverter 4 converts high-frequency power (DC power) into three-phase AC power on the basis of a control signal (for example, a PWM signal) of the U phase, the V phase, and the W phase input from a power control device not illustrated in the drawing.

The running motor 5 is a three-phase motor generating rotation power by using the three-phase AC power supplied from the inverter 4 for drive power. A vehicle according to this embodiment runs according to the rotation power generated by the running motor 5. Such a running motor 5, for example, is a three-phase DC motor having superior controllability.

The protection circuit 6 is a circuit that is disposed between the voltage detecting unit 7 and the battery pack 1 and is used for protecting the voltage detecting unit 7. While details will be described later, this protection circuit 6, as illustrated in FIG. 2, for example, is configured by fuses disposed between the output terminals (positive terminals and negative terminals) of the battery cells b1 to b12 and the input terminals of the voltage detecting unit 7 disposed in correspondence with the output terminals and protects the voltage detecting unit 7 by blocking the flow of an overcurrent into the input terminals of the voltage detecting unit 7.

The voltage detecting unit 7 is a circuit that detects the output voltage of the battery pack 1. While details will be described later, this voltage detecting unit 7, more specifically, includes dedicated ICs used for detecting the output voltages of the battery cells b1 to b12 and low pass filters disposed in correspondence with the output terminals of the battery cells b1 to b12. In addition, in each dedicated IC, in addition to the function of detecting the output voltage of each of the battery cells b1 to b12, a discharge circuit that forcibly discharges each of the battery cells b1 to b12 is arranged. Such a voltage detecting unit 7 outputs the output voltages of the battery cells b1 to b12 to the microcomputer 8.

Figure 2:
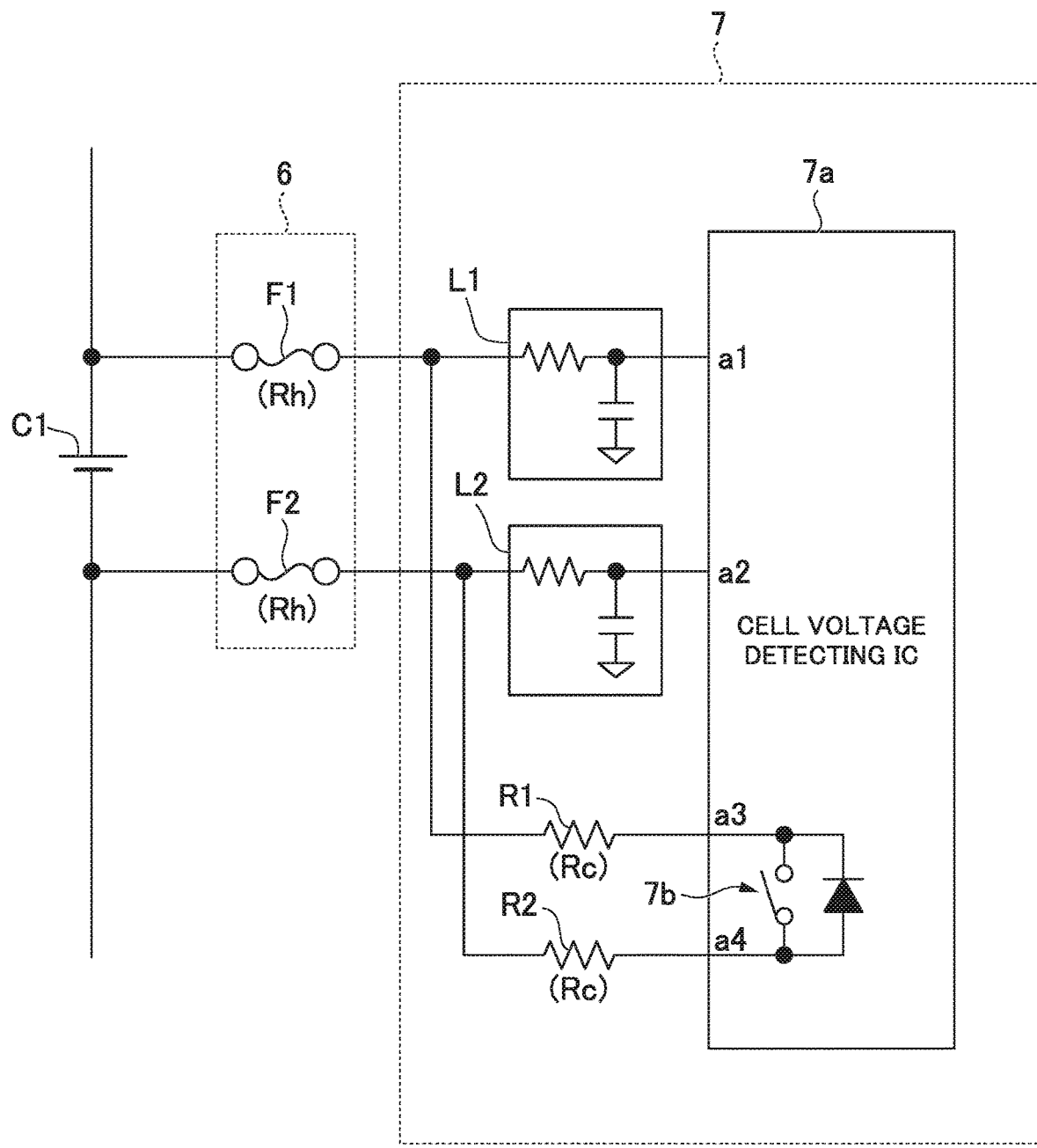
FIG. 2 is a circuit diagram illustrating a detailed configuration of a part of a voltage detecting apparatus according to an embodiment of the present invention.

FIG. 2 is a circuit diagram illustrating a detailed configuration of the protection circuit 6 and the voltage detecting unit 7 corresponding to the battery cell b1, as a representative example. In addition, the protection circuit 6 and the voltage detecting unit 7 corresponding to the battery cells b2 to b12 other than the battery cell b1 have a detailed configuration similar to that illustrated in FIG. 2.

In more detail, the protection circuit 6 is configured by a pair of fuses F1 and F2. Each of the pair of fuses F1 and F2 configures an electronic component that is fused and cut according to an overcurrent and has a predetermined internal resistance (a protection resistance value $R_h$). These protection resistance values $R_h$ change according to the use states of the fuses F1 and F2 in a time series.

The voltage detecting unit 7 is configured by a pair of low pass filters L1 and L2, a pair of discharge resistors R1 and R2, and a cell voltage detecting IC 7*a*. One fuse F1 has one end connected to the positive terminal of the battery cell b1 and the other end connected to an input terminal of the low pass filter L1 and one end of one discharge resistor R1. The other fuse F2 has one end connected to the negative terminal of the battery cell b1 and the other end connected to an input terminal of the low pass filter L2 and one end of the other discharge resistor R2.

The low pass filter L1 is a CR filter configured by a resistor and a capacitor, has an input terminal connected to the other end of the fuse F1, and has an output terminal connected to an input terminal a1 of the cell voltage detecting IC 7*a*. The low pass filter L2 is a CR filter configured by a resistor and a capacitor, has an input terminal connected to the other end of the other fuse F2, and has an output terminal connected to an input terminal a2 of the cell voltage detecting IC 7*a*.

One discharge resistor R1 has one end connected to the other end of the one fuse F1 and the other end connected to an input terminal a3 of the cell voltage detecting IC 7*a*. The other discharge resistor R2 has one end connected to the other end of the other fuse F2 and the other end connected to an input terminal a4 of the cell voltage detecting IC 7*a*. As illustrated in the drawing, each of this pair of the discharge resistors R1 and R2 has a discharge resistance value $R_c$. The cell voltage detecting IC 7*a* detects a difference between electric potentials of the pair of input terminals a1 and a2 as an output voltage of the battery cell b1 and includes an opening/closing switch 7*b* connected to the pair of input terminals a3 and a4.

This opening/closing switch 7*b* and the above-described pair of discharge resistors R1 and R2 configure a discharge circuit. In other words, this opening/closing switch 7*b*, by being in a closed state, connects the positive terminal and the negative terminal of the battery cell b1 through the pair of fuses F1 and F2 and the pair of discharge resistors R1 and R2, thereby discharging the battery cell b1.

The microcomputer 8 is a so-called one-chip microcomputer into which a central processing unit (CPU), a memory, an input/output interface, and the like are integrally built and executes a voltage detection function for the battery pack 1 by executing a voltage detecting program stored in an internal memory. More specifically, the microcomputer 8 determines a half-cut state of the protection circuit 6 by converting the output voltages of the battery cells b1 to b12 input from the voltage detecting unit 7 into digital values and performing a predetermined voltage correcting process for the digital values, calculates actual values (actual output voltages) obtained by correcting the output voltages, and outputs the actual calculated values to the battery ECU 9. Such a microcomputer 8 corresponds to a determination unit and a voltage correcting unit according to the present invention.

The battery ECU 9 is a device that controls the conduction from the battery pack 1 to the inverter of high-voltage power 4 by controlling the operations of the main contactor 2 and the sub contactor 3 described above on the basis of an operation instruction (for example, turning "On" an ignition switch) of a driver of a vehicle. In addition to the control of the main contactor 2 and the sub contactor 3 described above, this battery ECU 9 notifies the microcomputer 8 of the open/closed states of the main contactor 2 and the sub contactor 3 based on the control.

Next, the operation of the vehicle running system configured as such will be described in detail.

In this vehicle running system, by controlling the opening/closing of the main contactor 2 and the sub contactor 3 by using the battery ECU 9, the outputs of the battery pack 1 are fed to the inverter 4, and the inverter 4 is controlled by a running control device not illustrated in the drawing, whereby the running motor 5 is driven.

In other words, the battery ECU 9 functions as a power feed control device for the inverter 4.

The voltage detecting apparatus according to this embodiment operates to assist the function of the battery ECU 9. In other words, in a case where any of the output voltages of the battery cells b1 to b12 input from the microcomputer 8 represents an abnormal value, the battery ECU 9 sets the main contactor 2 and the sub contactor 3 to be in the open state, thereby stopping power feeding for the inverter 4.

Hereinafter, while the operation of the voltage detecting apparatus relating to the battery cell b1 will be described with reference to FIG. 2, the cell voltage detecting IC 7a of the voltage detecting unit 7 operates for all the battery cells b1 to b12 similar to the battery cell b1.

First, the cell voltage detecting IC 7a, in the Off state (non-operating state) of the opening/closing switch 7b, detects a difference between the positive electric potential and the negative electric potential of the battery cell b1 input to the pair of input terminals a1 and a2 respectively through the fuses F1 and F2 and the low pass filters L1 and L2 as a cell voltage Vc (first voltage). This cell voltage Vc has a value obtained by decreasing the cell voltage (in other words, an actual cell voltage Vr) in a case where the protection circuit 6 is not present, in other words, a case where the battery cell b1 and the voltage detecting unit 7 are directly connected to each other by a value corresponding to the internal resistance of the protection circuit 6, in other words, the resistance value Rh.

The cell voltage detecting IC 7a estimates the resistance value Rh (internal resistance) of each of the fuses F1 and F2 by setting the opening/closing switch 7b to the On state (operating state) for the cell voltage Vc at a predetermined timing and calculates the actual cell voltage Vr on the basis of a result of the estimation. In other words, when the cell voltage Vc is detected, the cell voltage detecting IC 7a sets the opening/closing switch 7b to the On state (operating state) only for a predetermined time and detects a difference between the electric potentials of the pair of input terminals a3 and a4 in this On state (operating state) as a correction cell voltage Va (second voltage).

Here, the protection voltage value Rh of each of the pair of fuses F1 and F2 that changes according to the use state is represented as in the following Equation (1) by using the cell voltage Vc (first voltage), the correction cell voltage Va (second voltage), and the discharge resistance value Rc of each of the pair of discharge resistors R1 and R2. Then, by using the protection resistance value Rh given according to this Equation (1), the actual cell voltage Vr is represented using the following Equation (2).

$$Rh = Rc \cdot (Vc - Va)/Va \qquad (1)$$

$$Vr = Va \cdot (Rh + Rc)/Rc \qquad (2)$$

In other words, the cell voltage detecting IC 7a estimates a protection resistance value Rh changing according to the use state by using Equation (1) described above, determines whether or not the protection circuit 6 is in a half-cut state by comparing the protection resistance value Rh obtained as a result of the estimation with a predetermined determination threshold, and obtains an actual cell voltage Vr by substituting the protection resistance value Rh obtained by using Equation (1) into Equation (2). According to the voltage detecting apparatus of this embodiment, a half-cut state of the protection circuit 6 can be detected, and a detection error in the cell voltage Vc due to the protection circuit 6 can be suppressed or corrected.

In addition, the cell voltage detecting IC 7a detects the cell voltage Vc and the correction cell voltage Va in a state in which the main contactor 2 and the sub contactor 3 are Off (open state), in other words, a state in which the battery pack 1 is not connected to the inverter 4 as a load. In other words, the battery ECU 9 sets the main contactor 2 and the sub contactor 3 to the Off state (open state) only for a predetermined time in a state in which the main contactor 2 and the sub contactor 3 are On (closed state), in other words, a state in which power is supplied from the battery pack 1 to the inverter 4 (load).

The cell voltage detecting IC 7a detects the cell voltage Vc and the correction cell voltage Va over the short time described above. Since a smoothing capacitor is disposed in the inverter 4, even if the main contactor 2 and the sub contactor 3 are in the Off state (open state) for a short time, there is no problem in driving the running motor 5 by using the inverter 4. In addition, in the state (open state) in which the main contactor 2 and the sub contactor 3 are Off, the load of the battery pack 1 is decreased, and accordingly, the cell voltage Vc and the correction cell voltage Va can be stably detected.

When the actual cell voltages Vr are sequentially obtained for all the battery cells b1 to b12, the cell voltage detecting IC 7a sequentially outputs the actual cell voltages Vr of the battery cells b1 to b12 to the battery ECU 9. Then, in a case where any of the actual cell voltages Vr of the battery cells b1 to b12 represents an abnormal value, the battery ECU 9 causes the main contactor 2 and the sub contactor 3 to transition from the On state (closed state) to the Off state (open state), thereby stopping the power feeding from the battery pack 1 to the inverter 4.

In addition, in a case where the protection resistance value Rh obtained using Equation (1) described above is greater than or equal to a predetermined threshold set in advance, the cell voltage detecting IC 7a determines that the pair of fuses F1 and F2, in other words, the protection circuit 6 has reached an abnormal state and outputs an instruction signal blocking a connection between the battery pack 1 and the inverter 4 as a load to the battery ECU 9. Then, when the instruction signal described above is input, the battery ECU 9 causes the main contactor 2 and the sub contactor 3 to transition from the On state (closed state) to the Off state (open state), thereby stopping power feeding from the battery pack 1 to the inverter 4.

The present invention is not limited to the embodiment described above and, for example, modifications as below may be considered.

(1) While the battery pack 1 is set as a voltage detection target in the embodiment described above, the present invention is not limited thereto. In addition, while the cell voltages Vc of the battery cells b1 to b12 configuring the battery pack 1 are set as a correction target in the embodiment described above, the present invention is not limited thereto.

(2) While the opening/closing switch 7b is disposed inside the cell voltage detecting IC 7a in the embodiment described above, the present invention is not limited thereto. The opening/closing switch 7b may be disposed separately from the cell voltage detecting IC 7a.

(3) While the protection circuit 6 is configured by a plurality of fuses in this embodiment, the present invention is not limited thereto. According to the present invention, the internal resistance of the protection circuit 6 is estimated on the basis of the first voltage and the second voltage, and an error in the first voltage is corrected on the basis of a result of the estimation. Thus, the protection circuit according to the present invention may be a circuit other than the fuses.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A voltage detecting apparatus comprising:
   a voltage detecting unit configured to detect a voltage of a battery supplying power to a load;
   a discharge circuit configured to discharge the battery;
   a protection circuit disposed between the voltage detecting unit and the battery and between the discharge circuit and the battery; and
   a determination unit configured to estimate an internal resistance of the protection circuit on the basis of a first voltage detected by the voltage detecting unit when the discharge circuit is in a non-operating state and a second voltage detected by the voltage detecting unit when the discharge circuit is in an operating state and determine a half-cut state of the protection circuit on the basis of a result of the estimation,
   wherein the protection circuit is a fuse that is fused and cut according to an overcurrent,
   wherein the discharge circuit is configured to include a pair of discharge resistors having one ends connected to input terminals of low pass filters and an opening/closing switch connected between the other ends of the pair of discharge resistors, and
   wherein the voltage detecting unit is configured to detect the first voltage on the basis of electric potentials input to a pair of the input terminals through the low pass filters and detect the second voltage on the basis of the electric potentials input to the pair of the input terminals at a time when the opening/closing switch is in an ON state.

2. The voltage detecting apparatus according to claim 1, further comprising a voltage correcting unit configured to correct an error in the first voltage on the basis of the result of the estimation.

3. The voltage detecting apparatus according to claim 1,
   wherein the battery is a battery pack configured by a plurality of battery cells,
   wherein the voltage detecting unit and the discharge circuit are disposed for each of the battery cells, and
   wherein the voltage correcting unit is configured to correct an error in the first voltage for each of the battery cells.

4. The voltage detecting apparatus according to claim 1, wherein the voltage detecting unit is configured to detect the first voltage and the second voltage in a state in which a connection between the battery and the load is blocked.

5. The voltage detecting apparatus according to claim 1, wherein the voltage correcting unit is configured to output an instruction signal blocking a connection between the battery and the load in a case where the internal resistance of the protection circuit estimated on the basis of the first voltage and the second voltage is greater than or equal to a predetermined threshold.

* * * * *